United States Patent
Fukunaga et al.

(10) Patent No.: US 11,319,646 B2
(45) Date of Patent: May 3, 2022

(54) GALLIUM ARSENIDE SINGLE CRYSTAL SUBSTRATE

(71) Applicant: Sumitomo Electric Industries, Ltd., Osaka (JP)

(72) Inventors: Hiroshi Fukunaga, Kobe (JP); Masanori Morishita, Kobe (JP); Tatsuya Moriwake, Kobe (JP); Katsushi Hashio, Kobe (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/288,153

(22) PCT Filed: Jul. 10, 2019

(86) PCT No.: PCT/JP2019/027270
§ 371 (c)(1),
(2) Date: Apr. 23, 2021

(87) PCT Pub. No.: WO2021/005731
PCT Pub. Date: Jan. 14, 2021

(65) Prior Publication Data
US 2021/0310155 A1    Oct. 7, 2021

(51) Int. Cl.
*C30B 29/42*    (2006.01)

(52) U.S. Cl.
CPC .................. *C30B 29/42* (2013.01)

(58) Field of Classification Search
CPC ... C30B 29/40; C30B 29/42; H01L 21/02639; H01L 21/02395; H01L 21/3245
See application file for complete search history.

(56) References Cited

U.S. PATENT DOCUMENTS

| 6,294,475 B1 * | 9/2001 | Schubert ........... H01L 21/30617 438/712 |
| 7,566,641 B2 * | 7/2009 | Liu .................. C30B 11/00 117/81 |

(Continued)

FOREIGN PATENT DOCUMENTS

| JP | H06-298588 A | 10/1994 |
| JP | 2011-148694 A | 8/2011 |
| JP | 2019-014647 A | 1/2019 |

OTHER PUBLICATIONS

Keigo Hoshikawa, "Vertical Bridgman Growth of Various Kinds of Single Crystals," Japanese Association for Crystal Growth, pp. 110-118, vol. 42, No. 2, 2015.

(Continued)

*Primary Examiner* — Jaehwan Oh
(74) *Attorney, Agent, or Firm* — Faegre Drinker Biddle & Reath LLP (57) ABSTRACT

The gallium arsenide single crystal substrate has a circular main surface, and when the diameter of the main surface of the gallium arsenide single crystal substrate is represented by D and the number of etch pits formed on the main surface by immersing the gallium arsenide single crystal substrate in molten potassium hydroxide at 500° C. for 10 minutes is counted, the number $C_1$ of etch pits in a first circular region having a diameter of 0.2D around the center of the main surface is 0 or more and 10 or less.

9 Claims, 3 Drawing Sheets

(56) References Cited

U.S. PATENT DOCUMENTS

| | | | | |
|---|---|---|---|---|
| 8,361,225 B2* | 1/2013 | Liu | ............. | C30B 29/42 |
| | | | | 117/83 |
| 8,986,446 B2* | 3/2015 | Oshika | ............. | C30B 27/00 |
| | | | | 117/15 |
| 2006/0272572 A1* | 12/2006 | Uematsu | ............. | H01L 21/0237 |
| | | | | 117/84 |
| 2009/0098377 A1* | 4/2009 | Oshika | ............. | C30B 29/42 |
| | | | | 428/338 |
| 2014/0065360 A1* | 3/2014 | D'Evelyn | ............. | C30B 29/403 |
| | | | | 428/141 |
| 2014/0205527 A1* | 7/2014 | Nakamura | ............. | C30B 27/00 |
| | | | | 423/275 |
| 2017/0101724 A1* | 4/2017 | Kiyama | ............. | C30B 25/165 |

OTHER PUBLICATIONS

Notice of Reasons for Refusal dated Aug. 18, 2020 for corresponding JP2020-500675, including English translation.

* cited by examiner

GALLIUM ARSENIDE SINGLE CRYSTAL SUBSTRATE

TECHNICAL FIELD

The present disclosure relates to a gallium arsenide single crystal substrate.

BACKGROUND ART

A gallium arsenide single crystal substrate is widely used in various semiconductor devices as a material. From the viewpoint of improving the performance of the device, it is required to reduce the dislocation density in the gallium arsenide single crystal substrate. Japanese Patent Laying-Open No. 06-298588 (PTL 1) discloses that a gallium arsenide single crystal having an outer diameter of 6.5 mm was formed as a perfect dislocation-free crystal by applying a component called a communicating capillary to a single crystal growth apparatus that may be used to carry out a vertical Bridgman method (hereinafter also referred to as the VB method). The dislocation density is determined by corroding the main surface of the gallium arsenide single crystal substrate in molten potassium hydroxide to form corrosion holes thereon as etch pits, and measuring the density of etch pits in the main surface.

CITATION LIST

Patent Literature

PTL 1: Japanese Patent Laying-Open No. 06-298588

SUMMARY OF INVENTION

A gallium arsenide single crystal substrate according to the present disclosure is such a gallium arsenide single crystal substrate that has a circular main surface, and when the diameter of the main surface of the gallium arsenide single crystal substrate is represented by D and the number of etch pits formed on the main surface by immersing the gallium arsenide single crystal substrate in molten potassium hydroxide at 500° C. for 10 minutes is counted, the number $C_1$ of etch pits in a first circular region having a diameter of 0.2D around the center of the main surface is 0 or more and 10 or less.

DETAILED DESCRIPTION

Problem to be Solved by the Present Disclosure

It is considered that the technology disclosed in PTL 1 is not practical. This is because that in the case where a communicating capillary is applied to a single crystal growth apparatus that may be used to carry out the VB method, it would be extremely difficult to grow a gallium arsenide single crystal in the single crystal growth apparatus. Therefore, a gallium arsenide single crystal substrate with sufficiently reduced dislocation density that satisfies the above requirement has not yet been realized, and the development thereof is desired.

Therefore, an object of the present disclosure is to provide a gallium arsenide single crystal substrate in which the dislocation density is reduced by suppressing dislocations at an interface between a seed crystal and a raw material melt in contact with the seed crystal during the process of growing a gallium arsenide single crystal.

Advantageous Effect of the Present Disclosure

According to the above, it is possible to provide a gallium arsenide single crystal substrate in which the dislocation density is reduced by suppressing dislocations at the interface between the seed crystal and the raw material melt in contact with the seed crystal during the process of growing a gallium arsenide single crystal.

DESCRIPTION OF EMBODIMENTS

In order to solve the problems mentioned above, the present inventors conducted extensive studies and accomplished the present disclosure. Specifically, in growing a gallium arsenide single crystal by the VB method, the present inventors found that by strictly controlling the temperature at the interface between the seed crystal and the raw material melt in contact with the seed crystal, among the dislocations present in the gallium arsenide single crystal, it is possible to suppress the dislocations at the interface. It is also found that the method of suppressing dislocations via controlling the temperature may be applied to any substrate of any size. Thus, according to the present disclosure, it is possible to obtain a gallium arsenide single crystal substrate that meets the demand for reduced dislocation density and large size.

First, embodiments of the present disclosure will be summarized. Regarding the crystallographic indications in the present specification, an individual orientation is indicated by [ ], a group of equivalent orientations is indicated by < >, an individual plane is indicated by ( ), and a group of equivalent planes is indicated by { }. When a crystallographic index is negative, it is usually indicated by placing "-" (bar) above the numeral, while in the present specification, it is indicated by placing a negative sign before the numeral.

First, embodiments of the present disclosure are enumerated hereinafter.

[1] The gallium arsenide single crystal substrate according to an aspect of the present disclosure is such a gallium arsenide single crystal substrate that has a circular main surface, and when the diameter of the main surface of the gallium arsenide single crystal substrate is represented by D and the number of etch pits formed on the main surface by immersing the gallium arsenide single crystal substrate in molten potassium hydroxide at 500° C. for 10 minutes is counted, the number $C_1$ of etch pits in a first circular region having a diameter of 0.2D around the center of the main surface is 0 or more and 10 or less. Thus, it is possible to reduce the dislocation density in the gallium arsenide single crystal substrate satisfying the requirements mentioned above.

[2] In the gallium arsenide single crystal substrate, the number $C_1$ of etch pits in the first circular region is preferably 0 or more and 5 or less. Thus, it is possible to further reduce the dislocation density in the gallium arsenide single crystal substrate.

[3] In the gallium arsenide single crystal substrate, a difference $C_2-C_1$ between the number $C_2$ of etch pits in a second circular region having a diameter of 0.5D round the center of the main surface and the number $C_1$ of etch pits in the first circular region is preferably 0 or more and 5 or less. Thus, it is possible to sufficiently reduce the dislocation density in the gallium arsenide single crystal substrate.

[4] In the gallium arsenide single crystal substrate, an etch pit density representing the number of etch pits in 1 $cm^2$ of the main surface is preferably 0 or more and 1000 or less. Thus, it is possible to reduce the dislocation density in the gallium arsenide single crystal substrate over the entire main surface.

[5] In the gallium arsenide single crystal substrate, the diameter D is preferably not less than 75 mm and not more than 205 mm. As to be described later, the present disclosure may be applied to a gallium arsenide single crystal substrate which has a main surface with a diameter of 75 mm or more and 205 mm or less. Thus, it is possible to reduce the dislocation density in a large-sized gallium arsenide single crystal substrate with a diameter of 75 mm or more and 205 mm or less.

[6] The main surface of the gallium arsenide single crystal substrate is preferably a {100} plane. Thus, the main surface is a surface excellent in electrical characteristics and optical characteristics. Thus, in the present disclosure, it is possible to reduce the dislocation density in the gallium arsenide single crystal substrate having a surface excellent in electrical characteristics and optical characteristics as the main surface.

[7] The main surface of the gallium arsenide single crystal substrate preferably has an off angle of greater than 0° and equal to or less than 15° from the {100} plane. Thus, the main surface is a surface excellent in electrical characteristics and optical characteristics. Thus, in the present disclosure, it is possible to reduce the dislocation density in the gallium arsenide single crystal substrate having a surface excellent in electrical characteristics and optical characteristics as the main surface.

[8] The gallium arsenide single crystal substrate preferably has an n-type conductivity. As to be described later in the present disclosure, an n-type conductivity may be effectively imparted to a gallium arsenide single crystal substrate. Thus, it is possible to reduce the dislocation density in the gallium arsenide single crystal substrate having an n-type conductivity.

[9] The gallium arsenide single crystal substrate preferably contains silicon, and the atomic concentration of the silicon is preferably $1\times10^{16}$ $cm^{-3}$ or more and $1\times10^{19}$ $cm^{-3}$ or less. Accordingly, an n-type conductivity may be effectively imparted to the gallium arsenide single crystal substrate. Thus, it is possible to reduce the dislocation density in the gallium arsenide single crystal substrate having an n-type conductivity.

DETAILS OF EMBODIMENTS

Hereinafter, embodiments of the present disclosure (hereinafter also referred to as the present embodiment) will be described in more detail, but the present disclosure is not limited thereto. In the following description and drawings, the same or corresponding elements will be denoted by the same reference numerals, and the description thereof will not be repeated.

In the present specification, the expression in the form of "A to B" refers to the upper limit and the lower limit of a range (in other words, A or more and B or less), and if it is described that A has no unit but B has a unit, it means that A and B have the same unit. Further, when a compound or the like is represented by a chemical formula in the present specification, unless specified in particular, the atomic ratio may be any atomic ratio known in the art, and is not necessarily limited to those in the stoichiometric range.

[Gallium Arsenide Single Crystal Substrate]

The gallium arsenide single crystal substrate (hereinafter also referred to as "GaAs single crystal substrate") according to the present embodiment has a circular main surface. When the diameter of the main surface of the GaAs single crystal substrate is represented by D and the number of etch pits formed on the main surface by immersing the GaAs single crystal substrate in molten potassium hydroxide at 500° C. for 10 minutes is counted, the number $C_1$ of etch pits in a first circular region having a diameter of 0.2D around the center of the main surface is 0 or more and 10 or less.

In the GaAs single crystal substrate satisfying the requirements as described above, the number of etch pits caused by dislocations at the interface between the seed crystal and the raw material melt in contact with the seed crystal during the process of growing the GaAs single crystal is significantly reduced than that in the conventional one. As a result, the GaAs single crystal substrate may have a very low dislocation density. The GaAs single crystal substrate is preferably cut out, for example, from a GaAs single crystal grown by a growing method, which will be described later, in such a manner that the main surface thereof is a {100} plane. Hereinafter, a GaAs single crystal substrate which is cut out in such a manner that the main surface thereof is a {100} plane having no off angle (hereinafter also referred to as the {100} just plane) will be described as an example of the GaAs single crystal substrate according to the present embodiment.

<Main Surface>

Figure 1:
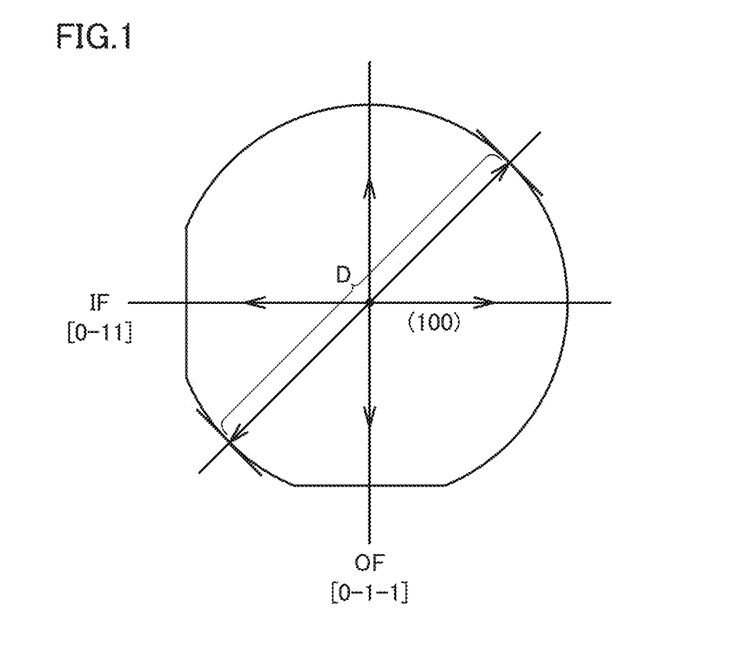
FIG. 1 is a plan view illustrating an example of a main surface of a gallium arsenide single crystal substrate according to the present disclosure.

As described above, the GaAs single crystal substrate according to the present embodiment has a circular main surface. In the present specification, the circular shape that is used to denote the shape of the main surface not only includes a case in which the main surface is geometrically circular, but also includes a case in which the main surface is not geometrically circular due to the formation of at least one of an orientation flat (hereinafter also referred to as "OF") and an index flat (hereinafter also referred to as "IF") as illustrated in FIG. 1. Further, the "circular shape" includes a case in which the main surface is not geometrically circular because the GaAs single crystal, from which the GaAs single crystal substrate is cut out, is not geometrically circular.

In the present specification, the center of the main surface refer to the center of a virtual circle by assuming that the main surface is a circle without taken into consideration the OF, the IF or the like even though the main surface is not geometrically circular due to the formation of the OF, the IF or the like in the GaAs single crystal substrate. In a GaAs single crystal substrate, when the main surface is the (100) plane, generally the OF is in the [0-1-1] direction and the IF is in the [0-11] direction. The crystal orientation of the single crystal constituting the GaAs single crystal substrate is determined by the position thereof with respect to the OF and the IF. Also, the front surface and the back surface of the substrate may be determined by the position thereof with respect to the OF and the IF.

Further, as described above, in the GaAs single crystal substrate, the diameter of the main surface is represented by D. In this case, the diameter D refers to the longest line segment among those line segments that extend between two points on the outer periphery of the main surface across the center of the main surface.

<Number of Etch Pits>

When the diameter of the main surface of the GaAs single crystal substrate is represented by D and the number of etch pits formed on the main surface by immersing the GaAs single crystal substrate in molten potassium hydroxide at 500° C. for 10 minutes is counted, the number $C_1$ of etch pits in a first circular region having a diameter of 0.2D around the center of the main surface is 0 or more and 10 or less. In the GaAs single crystal substrate, the number $C_1$ of etch pits in the first circular region is preferably 0 or more and 5 or less, and most preferably, the number $C_1$ of etch pits in the first circular region is 0.

In the present specification, the "etch pits" refer to corrosion holes formed on the surface of the GaAs single crystal substrate by treating the surface with a chemical agent, and specifically refer to the corrosion holes formed on the main surface by immersing the GaAs single crystal substrate in molten potassium hydroxide at 500° C. for 10 minutes as described above. When the main surface of the GaAs single crystal substrate is observed by an optical microscope which will be described later, each corrosion hole appears as a white spot on the main surface. In the GaAs single crystal substrate according to the present embodiment, the number of the corrosion holes (etch pits) is 0 or more and 10 or less in the first circular region having a diameter of 0.2D around the center of the main surface. The etch pits are not technically synonymous with dislocations, but may be regarded as equivalent to dislocations in the present technical art. Thus, a GaAs single crystal substrate in which the number of etch pits on the main surface is reduced may be regarded as a GaAs single crystal substrate in which the dislocation density is reduced.

(First Circular Region)

The first circular region is such a region that has a diameter of 0.2D around the center of the main surface of the GaAs single crystal substrate. Therefore, the first circular region is concentric with the main surface. For example, when the main surface of the GaAs single crystal substrate has a diameter of 100 mm, the first circular region is a region on the main surface surrounded by a circle having a diameter of 20 mm around the center of the main surface.

(Method of Counting the Number of Etch Pits)

Hereinafter, a method of counting the number of etch pits formed on the main surface of the GaAs single crystal substrate will be described. First, as described above, the surface of the GaAs single crystal substrate is immersed in molten potassium hydroxide at 500° C. for 10 minutes. Any conventional method may be used to immerse the GaAs single crystal substrate. Next, the GaAs single crystal substrate is moved out of the molten potassium hydroxide, and the first circular region on the main surface (for example, the {100} just surface) is observed under a conventional optical microscope (for example, trade name: ECLIPSE (registered trademark) LV150N manufactured by Nikon Corporation) at a magnification of 100 times (and accordingly, one field of view has a dimension of 1 mm$^2$, i.e., 1 mm×1 mm) so as to count the number of etch pits in one field of view. In this case, the number of etch pits is counted in the entire first circular region by moving the GaAs single crystal substrate or the like so as to set the fields of view in the entire first circular region without overlapping each other. In the case where the boundary of the first circular region is present in one field of view, when an etch pit is present in the field of view even though it is outside the first circular region, this etch pit will be counted.

(Second Circle Region)

In the GaAs single crystal substrate, a difference $C_2$-$C_1$ between the number $C_2$ of etch pits in a second circular region having a diameter of 0.5D around the center of the main surface and the number $C_1$ of etch pits in the first circular region is preferably 0 or more and 5 or less. The second circular region is such a region that has a diameter of 0.5D around the center of the main surface of the GaAs single crystal substrate. Therefore, the second circular region is concentric with the main surface and the first circular region. When the main surface of the GaAs single crystal substrate has a diameter of 100 mm, for example, the second circular region is a region on the main surface surrounded by a circle having a diameter of 50 mm around the center of the main surface.

In other words, the difference $C_2$-$C_1$ between the number $C_2$ of etch pits in the second circular region and the number $C_1$ of etch pits in the first circular region refers to the number of etch pits in a region (hereinafter also referred to as the toroidal region) on the main surface sandwiched between a circle having a diameter of 0.2D around the center of the main surface of the GaAs single crystal substrate and a circle having a diameter of 0.5D around the center of the main surface is counted. That is to say, in the GaAs single crystal substrate, the number $C_2$-$C_1$ of etch pits in the toroidal region is preferably 0 or more and 5 or less. Thereby, it is possible to provide a GaAs single crystal substrate in which the number of etch pits caused by the dislocations at the interface between the seed crystal and the raw material melt in contact with the seed crystal is sufficiently reduced during the process of growing the GaAs single crystal. Note that if an etch pits is present across both the first circular region and the second circular region, it is counted into the number $C_1$ of etch pits in the first circular region. The number $C_2$ of etch pits in the second circular region may be counted by using the same method as the method of counting the number $C_1$ of etch pits in the first circular region. The number $C_2$-$C_1$ of etch pits in the toroidal region is most preferably 0.

<Etch Pit Density: EPD>

In the GaAs single crystal substrate, an etch pit density (hereinafter also referred to as "EPD") representing the number of etch pits in 1 cm$^2$ of the main surface is preferably 0 or more and 1000 or less. Thus, it is possible to provide a GaAs single crystal substrate with the dislocation density reduced over the entire main surface. In the GaAs single crystal substrate, the EPD is more preferably 0 or more and 500 or less, and still more preferably 0 or more and 100 or less. The EPD is most preferably 0 or more and 10 or less.

(Method of Calculating EPD)

Hereinafter, a method of calculating the EPD of the GaAs single crystal substrate will be described. First, the main surface of the GaAs single crystal substrate is observed under the optical microscope mentioned above, and the number of etch pits in a field of view of 1 mm$^2$ is counted by the same method as that used to count the number $C_1$ of etch pits in the first circular region. In this case, the number of etch pits in the entire main surface is counted by moving the GaAs single crystal substrate or the like so as to set each field of view in the entire main surface without overlapping each other. Next, the total number of etch pits counted from the entire main surfaces is divided by the total area of the main surface, and thereby the EPD is calculated as the number of etch pits in 1 cm² of the main surface. However, a region from the outer edge of the GaAs single crystal substrate to the inner side by 5 mm is excluded from the area for calculating the EPD because the number of etch pits varies greatly in this region for each substrate and this region is generally not used as the material of a semiconductor device.

<Diameter D of Main Surface>

In the GaAs single crystal substrate according to the present embodiment, the diameter D is preferably not less than 75 mm and not more than 205 mm. In the GaAs single crystal substrate, the diameter D is more preferably not less than 100 mm and not more than 205 mm. In the GaAs single crystal substrate, the diameter D is further preferably 150 mm or more and 205 mm or less. In other words, according to the present disclosure, the dislocation density is reduced in a large-sized GaAs single crystal substrate that has a diameter of 75 mm or more and 205 mm or less. Thus, the GaAs single crystal substrate may be made larger in size, and when manufacturing a semiconductor device from the large-sized GaAs single crystal substrate, the manufacturing cost thereof may be reduced.

In the present specification, a GaAs single crystal substrate having the diameter D of 75 mm or about 75 mm (in the range of 75 to 76.5 mm) is referred to as a 3-inch disk-shaped GaAs single crystal substrate. A GaAs single crystal substrate having the diameter D of 100 mm or about 100 mm (in the range of 95 to 105 mm) is referred to as a 4-inch disk-shaped GaAs single crystal substrate. A GaAs single crystal substrate having the diameter D of 125 mm or about 125 mm (in the range of 120 to 130 mm) is referred to as a 5-inch disk-shaped GaAs single crystal substrate. Similarly, a GaAs single crystal substrate having the diameter D of 150 mm or about 150 mm (in the range of 145 to 155 mm) is referred to as a 6-inch disk-shaped GaAs single crystal substrate. A GaAs single crystal substrate having the diameter D of 200 mm or about 200 mm (in the range of 195 to 205 mm) is referred to as an 8-inch disk-shaped GaAs single crystal substrate. The diameter D may be measured by using a conventional outer diameter measuring instrument such as a caliper.

<Off Angle of Main Surface>

Figure 2:
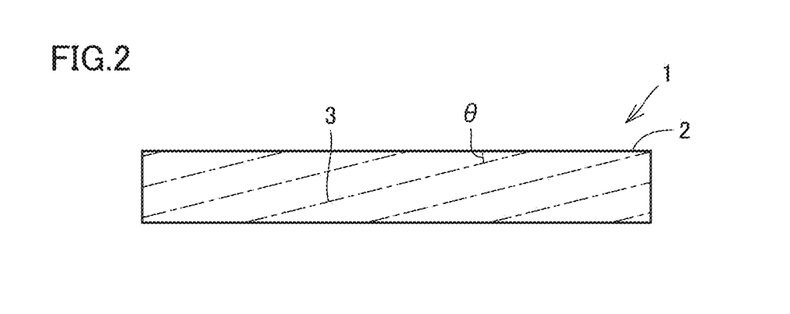
FIG. 2 is a cross-sectional view illustrating a cross section of a gallium arsenide single crystal substrate which has an off angle.

The main surface of the GaAs single crystal substrate according to the present embodiment is preferably a {100} plane. For example, the main surface of the GaAs single crystal substrate illustrated in FIG. 1 is a (100) plane. Further, as illustrated in FIG. 2, the main surface of the GaAs single crystal substrate preferably has an off angle of greater than 0° and equal to or less than 15° from the {100} plane. In FIG. 2, the main surface 2 is inclined at an off angle θ of greater than 0° and equal to or less than 15° from the {100} plane. For example, in the GaAs single crystal substrate 1 illustrated in FIG. 2, a plane 3 indicated by the dashed line is the (100) plane.

When the main surface of the GaAs single crystal substrate is a {100} plane or when the main surface has an off angle of greater than 0° and equal to or less than 15° from the {100} plane, the main surface of the GaAs single crystal substrate is excellent in electrical characteristics and optical characteristics. Thus, according to the present embodiment, it is possible to reduce the dislocation density in a GaAs single crystal substrate having a surface excellent in electrical characteristics and optical characteristics as the main surface, thereby improving the characteristics of a semiconductor device. More preferably, the main surface of the GaAs single crystal substrate is a {100} plane, or the main surface has an off-angle of greater than 0° and equal to or less than 10° from the {100} plane. Most preferably, the main surface of the GaAs single crystal substrate is a {100} plane, or the main surface has an off angle of greater than 0° and equal to or less than 5° from the {100} plane.

The off angle of the main surface of the GaAs single crystal substrate with respect to the {100} plane may be measured by using a conventional single crystal orientation measuring apparatus (for example, product name (product No.): 2991G2 manufactured by Rigaku Corporation).

As described above, the GaAs single crystal substrate according to the present embodiment is preferably cut out, for example, from a GaAs single crystal grown by a growing method, which will be described later, in such a manner that the main surface thereof is a {100} just plane having no off angle. In order to obtain such a GaAs single crystal substrate, the orientation of the interface between the seed crystal and the raw material melt in contact with the seed crystal is preferably the same as that of the {100} just plane. Further, the growth direction of the GaAs single crystal is preferably the same as the <100> direction.

Further, a GaAs single crystal substrate, the main surface of which has an off-angle of greater than 0° and equal to or less than 15° from the {100} plane, may be obliquely cut out according to a conventional method from a GaAs single crystal grown by a growing method to be described later. In this case, the number of etch pits and the EPD on the main surface of the GaAs single crystal substrate which has an off angle of greater than 0° and equal to or less than 15° from the {100} plane are substantially the same as those on the main surface of the GaAs single crystal substrate which is the {100} just plane.

<n-Type GaAs Single Crystal Substrate>

Preferably, the GaAs single crystal substrate according to the present embodiment has an n-type conductivity. A GaAs single crystal substrate having an n-type conductivity may be formed by adding a predetermined impurity element to the seed crystal which serves as a raw material of the GaAs single crystal substrate. The impurity element added to the seed crystal is not particularly limited as long as a GaAs single crystal substrate having an n-type conductivity may be formed, but from the viewpoint of providing an n-type conductivity effectively and easily, the impurity element is preferably silicon.

In other words, the GaAs single crystal substrate according to the present embodiment preferably contains silicon. In this case, the atomic concentration of silicon is preferably $1\times10^{16}$ cm$^{-3}$ or more and $1\times10^{19}$ cm$^{-3}$ or less. The atomic concentration of silicon is more preferably $1\times10^{18}$ cm$^{-3}$ or more and $1\times10^{19}$ cm$^{-3}$ or less. The atomic concentration of silicon in the GaAs single crystal substrate may be determined by using a GDMS (Glow Discharge Mass Spectrometry).

[Method of Manufacturing GaAs Single Crystal Substrate]

The method of manufacturing a GaAs single crystal substrate according to the present embodiment is not particularly limited as long as it is possible to manufacture a GaAs single crystal substrate in which the number $C_1$ of etch pits in the first circular region is 0 or more and 10 or less as described above. However, from the viewpoints of reducing the number $C_1$ of etch pits and improving the processing yield, it is preferable to manufacture a GaAs single crystal substrate by the following manufacturing method, for example. As to be described later, the present inventors have found that, in growing a GaAs single crystal by the VB method, by strictly controlling the temperature in the vicinity of the interface between a GaAs seed crystal and a raw material melt in contact with the GaAs seed crystal, it is possible to obtain a GaAs single crystal in which the number of etch pits is reduced, which makes it possible to obtain a GaAs single crystal substrate in which the number of etch pits is reduced.

In the present specification, the term of "processing yield" refers to a rate of a qualified GaAs single crystal substrate that may be obtained among the GaAs single crystal substrates manufactured from a series of steps. The term "qualified" specifically means that, after a series of steps including a step of growing a GaAs single crystal, a step of slicing the GaAs single crystal to a desired thickness to form a GaAs single crystal substrate precursor, and a step of grinding the outer peripheral surface of the GaAs single crystal substrate precursor, no cracks, no chips or the like occur in the GaAs single crystal substrate precursor and the GaAs single crystal substrate.

Figure 3:
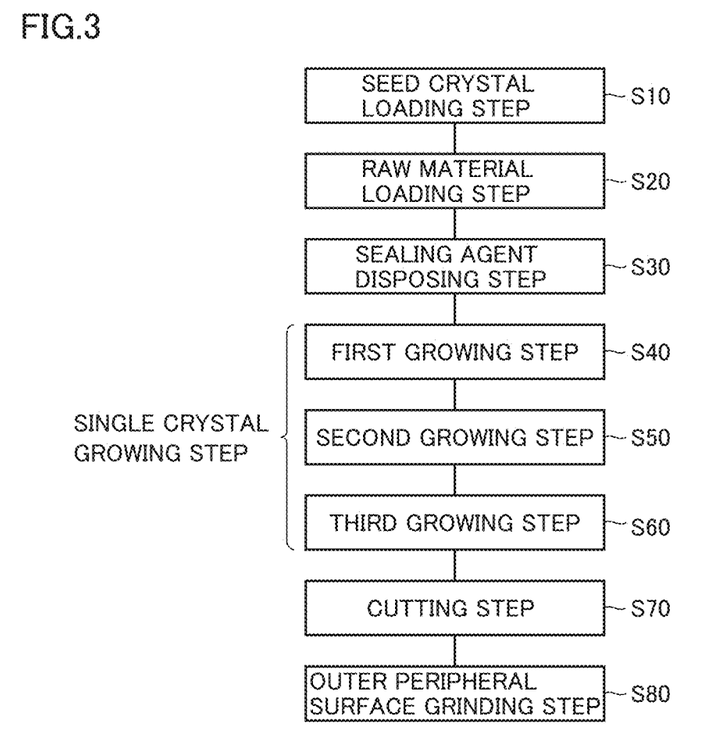
FIG. 3 is a flowchart schematically illustrating a manufacturing process for manufacturing a gallium arsenide single crystal substrate according to the present disclosure.
Figure 4:
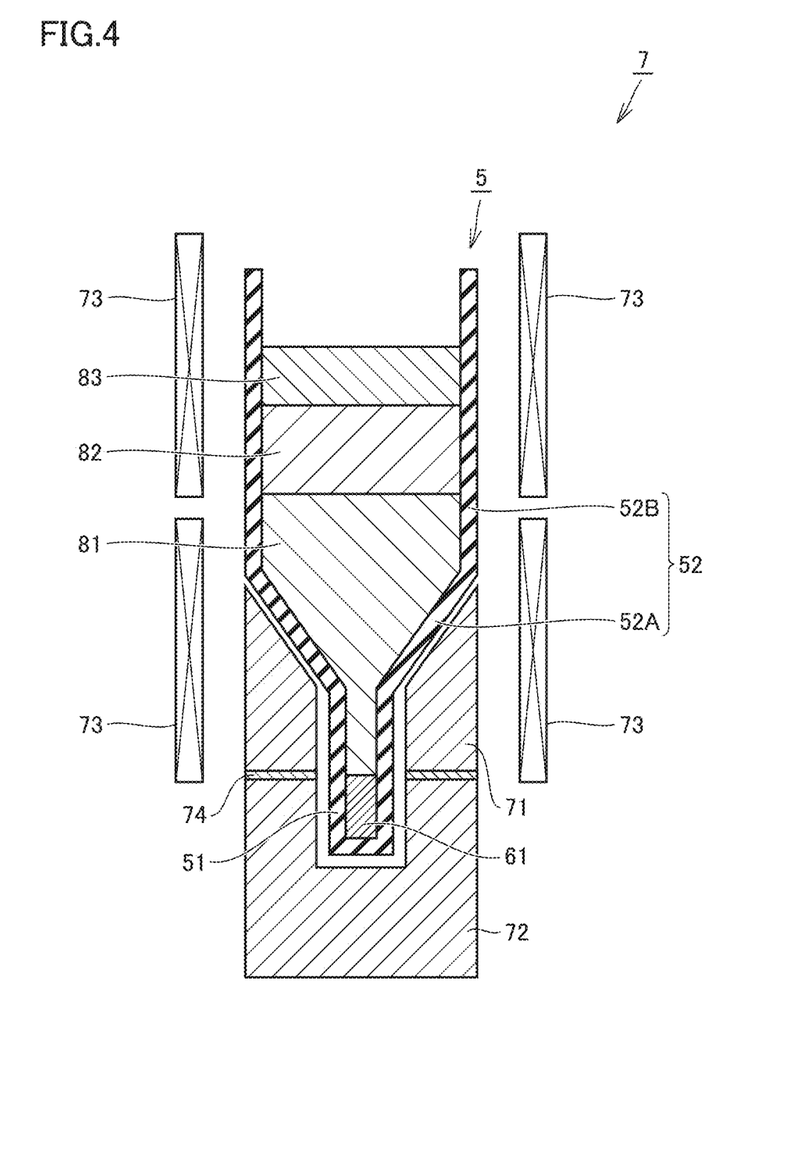
FIG. 4 is a schematic cross-sectional view illustrating an example of a single crystal growth apparatus for manufacturing a gallium arsenide single crystal substrate according to the present disclosure.

Hereinafter, with reference to FIGS. 3 to 4, the description will be given on a VB method using a crucible such as a vertical Bridgeman method or a vertical temperature gradient solidification method which is employed as an example method of manufacturing a GaAs single crystal substrate. Specifically, as illustrated by the flowchart in FIG. 3, the method of manufacturing a GaAs single crystal substrate based on the VB method includes a seed crystal loading step S10, a raw material loading step S20, a sealing agent disposing step S30, a single crystal growing step (which includes a first growing step S40, a second growing step S50 and a third growing step S60), a cutting step S70, and an outer peripheral surface grinding step S80 to be performed in this order. As illustrated in FIG. 4, for example, a single crystal growth apparatus 7 equipped with a crucible 5 may be used to carry out the method of manufacturing a GaAs single crystal substrate.

The crucible 5 in the single crystal growth apparatus 7 includes a seed crystal housing member 51 and a single crystal growing member 52 connected to the seed crystal housing member 51. The seed crystal housing member 51 is a cylinder-shaped member provided with a cylindrical cavity which is opened on the side connected to the single crystal growing member 52 and is formed with a bottom wall on the opposite side. The seed crystal housing member 51 is configured to house the GaAs seed crystal in the cavity. The single crystal growing member 52 includes a conical portion 52A and a cylindrical portion 52B. The conical portion 52A has a conical shape, and is connected to the seed crystal housing member 51 at the small diameter side in the axial direction. The cylindrical portion 52B has a hollow cylindrical shape, and is connected to the large diameter side of the conical portion 52A in the axial direction. The single crystal growing member 52 is configured to hold a solid GaAs raw material inside. The single crystal growing member 52 is further configured to grow a GaAs single crystal by solidifying the raw material that is heated to a molten state (hereinafter also referred to as the raw material melt). The crucible 5 may be made of various materials that can withstand at least the melting temperature of GaAs. For example, pyrolytic boron nitride (PBN) may be used as a suitable material to produce the crucible 5.

The single crystal growth apparatus 7 further includes a crucible supporting member configured to support the crucible 5 and a heating member 73 arranged to surround the crucible 5. The crucible supporting member includes an upper crucible-supporting member 71 made of a material having a lower thermal conductivity, a lower crucible-supporting member 72 made of a material having a thermal conductivity higher than that of the upper crucible-supporting member 71, and a heat insulating material 74 disposed between the upper crucible-supporting member 71 and the lower crucible-supporting member 72. As to be described later, in order to carry out the first growing step S40, the heat insulating material 74 is disposed between the upper crucible-supporting member 71 and the lower crucible-supporting member 72 at a position having the same level in the horizontal direction as the interface on the growth side of the GaAs seed crystal 61 loaded into the seed crystal housing member 51. The upper crucible-supporting member 71 may be made of, for example, quartz or alumina. The lower crucible-supporting member 72 may be made of, for example, silicon carbide. The heat insulating material 74 may be made of, for example, ceramic fibers containing alumina, quartz or the like as the main component. Since the single crystal growth apparatus 7 includes a crucible supporting member (the upper crucible-supporting member 71, the lower crucible-supporting member 72, and the heat insulating material 74), it is possible to strictly control the temperature in the vicinity of the interface between the GaAs seed crystal 61 and the raw material melt 82 in contact with the GaAs seed crystal 61 in the first growing step S40 which will be described later. Hereinafter, each step in the method of manufacturing a GaAs single crystal substrate will be described in detail.

<Seed Crystal Loading Step S10>

In the method of manufacturing a GaAs single crystal substrate, first, a seed crystal loading step S10 is performed. In the seed crystal loading step S10, the GaAs seed crystal 61 is loaded into the cavity of the seed crystal housing member 51 of the crucible 5. A conventional method may be used to load the GaAs seed crystal 61 into the seed crystal housing member 51.

<Raw Material Loading Step S20>

Next, a raw material loading step S20 is performed. In the raw material loading step S20, for example, a plurality of raw material bulks made of polycrystal GaAs are loaded into the crucible 5 and stacked in the conical portion 52A and the cylindrical portion 52B of the single crystal growing member 52.

<Sealing Agent Disposing Step S30>

Next, a sealing agent disposing step S30 is performed. In the sealing agent disposing step S30, any sealing agent (for example, a solid sealing agent made of boron oxide ($B_2O_3$)) publicly known in the VB method is disposed on the raw material bulks.

<Single Crystal Growing Step (S40 to S60)>

Next, a single crystal growing step is performed. The single crystal growing step includes a first growing step S40, a second growing step S50 and a third growing step S60, which are performed in this order. In the single crystal growing step, the crucible 5, inside which the GaAs seed crystal 61, the GaAs raw material bulks and the sealing agent are disposed via the steps of S10 to S30, is loaded into the single crystal growth apparatus 7 and arranged on the crucible supporting member (the upper crucible-supporting member 71). Thereafter, an electric current is supplied to the heating member 73, and thereby the crucible 5 is heated. As a result, the sealing agent disposed on the raw material is melted into a liquid sealing agent 83, and the GaAs raw material is melted into a raw material melt 82 in contact. Hereinafter, the first growing step S40, the second growing step S50, and the third growing step S60 of the single crystal growing step will be described in detail.

(First Growing Step S40)

In the first growing step S40, the raw material disposed at the interface with the GaAs seed crystal 61 and a part of the GaAs seed crystal 61 housed in the seed crystal housing member 51 are melted, and a GaAs single crystal 81 is grown from the GaAs seed crystal 61. In the first growing step S40, firstly, the heating member 73 is controlled so as to form a temperature gradient of 0.1 to 0.5° C./mm in the axial direction of the seed crystal housing member 51 for the GaAs seed crystal 61 housed in the cavity of the seed crystal housing member 51 and the raw material. Thereby, the raw material disposed at the interface with the GaAs seed crystal 61 is melted into the raw material melt 82, and a part of the GaAs seed crystal 61 (about 50% by volume of the GaAs seed crystal 61 from the side of the raw material melt 82) is melted. More specifically, a temperature gradient of 0.1 to 0.5° C./mm is formed in the axial direction of the seed crystal housing member 51 by setting the side of the seed crystal housing member 51 which is connected to the single crystal growing member 52 where the raw material and the raw material melt 82 are located to a high temperature, and the side of the bottom wall of the seed crystal housing member 51 where the GaAs seed crystal 61 are disposed to a low temperature. Further specifically, it is preferable the highest temperature on the side of the seed crystal housing member 51 which is connected to the single crystal growing member 52 is set at 1243 to 1248° C. and a temperature gradient of 0.1 to 0.5° C./mm is formed in the axial direction of the seed crystal housing member 51, whereby the lowest temperature on the side of the bottom wall of the seed crystal housing member 51 is controlled at 1228 to 1233° C.

In the first growing step S40, if the temperature gradient in the axial direction of the seed crystal housing member 51 is less than 0.1° C./mm, the GaAs tends to become polycrystallized in the crucible 5, which makes it difficult to grow the GaAs into a single crystal. On the other hand, if the temperature gradient exceeds 0.5° C./mm, the number of etch pits in the first circular region of the main surface of the GaAs single crystal substrate tends to become more than 10.

Next, in the first growing step S40, the heating member 73 is gradually lifted upward along the crucible 5 (toward the side of the single crystal growing member 52) in the axial direction so as to form a temperature gradient in the axial direction of the crucible 5 such that the temperature on the side of the GaAs seed crystal 61 is relatively lower and the temperature on the side of the raw material melt 82 is relatively higher. As a result, the melted part of the GaAs seed crystal 61, the raw material melt 82 in contact with the GaAs seed crystal 61, and the raw material melt 82 in the conical portion 52A are solidified, which enables the growth of the GaAs single crystal 81. The growth of the GaAs single crystal 81 may continue until the raw material melt 82 in the conical portion 52A is completely solidified, for example. In the first growing step S40, the lifting speed of the heating member 73 may be, for example, not less than 1 mm/h and not more than 5 mm/h.

(Second Growing Step S50)

The second growing step S50 is performed after the first growing step S40. In the second growing step S50, the raw material melt 82 in the cylindrical portion 52B is solidified. In the second growing step S50, the heating member 73 is lifted upward in the axial direction at a speed such as 2 mm/h or more which is higher than that in the first growing step S40, whereby the raw material melt 82 in the cylindrical portion 52B may be solidified from the side of the seed crystal housing member 51, which enables the growth of the GaAs single crystal 81 toward the side of the liquid sealing agent 83.

(Third Growing Step S60)

The third growing step S60 is performed after the second growing step S50. In the third growing step S60, the raw material melt 82 remaining in the cylindrical portion 52B is completely solidified. After the third growing step S60, the single crystal growing step is ended. Thereby, the GaAs single crystal 81 is formed in the crucible 5, and then the GaAs single crystal 81 is taken out of the crucible 5.

<Cutting Step S70 and Outer Peripheral Surface Grinding Step S80>

In the cutting step S70, a GaAs single crystal substrate precursor is obtained by cutting the GaAs single crystal 81 taken out of the crucible 5. Thereafter, in the outer peripheral surface grinding step S80, the outer peripheral surface of the GaAs single crystal substrate precursor is ground to form a GaAs single crystal substrate having a circular main surface. The cutting step S70 and the outer peripheral surface grinding step S80 each may be performed respectively according to a conventional cutting process and a conventional outer peripheral surface grinding process publicly known in the method of manufacturing a GaAs single crystal substrate using a VB method.

(Effect)

As mentioned above, by performing the steps S10 to S80, it is possible to manufacture a GaAs single crystal substrate having a circular main surface. When the diameter of the main surface of the GaAs single crystal substrate is represented by D and the number of etch pits formed on the main surface is counted by immersing the GaAs single crystal substrate in molten potassium hydroxide at 500° C. for 10 minutes, the number $C_1$ of etch pits in a first circular region having a diameter of 0.2D around the center of the main surface is 0 or more and 10 or less. In addition, the GaAs single crystal substrate may be manufactured from the steps mentioned above at a satisfactory processing yield.

In the method of manufacturing a GaAs single crystal substrate, the orientation of the interface of the GaAs seed crystal 61 on the side of the raw material melt 82 (in the growth direction) is preferably the same as that of the {100} just plane having no off angle. Further, the growth direction of the GaAs single crystal 81 is preferably in the <100> direction. The GaAs single crystal substrate according to the present embodiment is preferably cut out from the GaAs single crystal 81 with the {100} just plane as the main surface. Furthermore, a GaAs single crystal substrate, the main surface of which has an off angle of greater than 0° and equal to or less than 15° from the {100} plane, may be obliquely cut out according to a conventional method from a GaAs single crystal whose growth direction is in the <100> direction.

EXAMPLES

Hereinafter, the present disclosure will be described in more detail with reference to examples, but the present disclosure is not limited thereto. In each of Examples and Comparative Examples to be described later, the single crystal growth apparatus 7 as illustrated in FIG. 4 was used to grow a GaAs single crystal in the growth direction the same as the <100> direction according to the VB method, and a GaAs single crystal substrate in which the plane orientation of the main surface is the same as the {100} plane was obtained from the GaAs single crystal. In each of Examples and Comparative Examples, 200 pieces of the GaAs single crystal substrates were manufactured.

[Manufacture of GaAs Single Crystal Substrate]

Example 1

(Seed Crystal Loading Step S10)

The GaAs seed crystal 61 grown by a conventional method was loaded into the cavity of the seed crystal housing member 51 of the crucible 5 in the single crystal growth apparatus 7 by a conventional method. A minute amount of silicon (Si) was added to the GaAs seed crystal 61 as an impurity element.

(Raw material loading step S20 and sealing agent disposing step S30)

A plurality of raw material bulks made of polycrystal GaAs were loaded into the crucible 5 and stacked in the conical portion 52A and the cylindrical portion 52B. Further, a sealing agent made of $B_2O_3$ was disposed on the raw material bulks. In the present example, the inner diameter of the cylindrical portion 52B of the crucible 5 was 86 mm.

(First Growing Step S40)

An electric current was supplied to the heating member 73, and thereby the crucible 5 was heated. As a result, the sealing agent was melted into a liquid sealing agent 83, and the raw material bulks loaded into the conical portion 52A and the cylindrical portion 52B were melted into a raw material melt 82. Further, the heating member 73 configured to heat the seed crystal housing member 51 was controlled so as to form a temperature gradient of 0.26° C./mm in the axial direction of the seed crystal housing member 51 for the GaAs seed crystal 61 housed in the cavity of the seed crystal housing member 51 and the raw material. Thereby, the raw material disposed at the interface with the GaAs seed crystal 61 was melted into the raw material melt 82, and a part of the GaAs seed crystal 61 was melted. Specifically, the highest temperature on the side of the seed crystal housing member 51 which is connected to the single crystal growing member 52 was set at 1244.5° C. and a temperature gradient of 0.26° C./mm was formed in the axial direction of the seed crystal housing member 51, whereby the lowest temperature on the side of the bottom wall of the seed crystal housing member 51 was controlled at 1231.5° C.

Next, the heating member 73 was gradually lifted upward along the crucible 5 (toward the side of the single crystal growing member 52) in the axial direction, and thereby the melted part of the GaAs seed crystal 61, the raw material melt 82 in contact with the GaAs seed crystal 61, and the raw material melt 82 in the conical portion 52A were solidified. The lifting speed of the heating member 73 was set to 2 mm/h.

(Second Growing Step S50)

After the first growing step S40, the raw material melt 82 in the cylindrical portion 52B was solidified. In this step, the lifting speed of the heating member 73 was set to 2 mm/h.

(Third Growing Step S60)

After the second growing step S50, the raw material melt 82 remaining in the cylindrical portion 52B was completely solidified. Thereby, the GaAs single crystal 81 was formed in the crucible 5. Then, the GaAs single crystal 81 was taken out of the crucible 5 by a conventional method.

(Cutting Step S70 and Outer Peripheral Surface Grinding Step S80)

A GaAs single crystal substrate precursor was formed by cutting the GaAs single crystal 81 taken out of the crucible 5 according to a conventional cutting method, and the outer peripheral surface of the GaAs single crystal substrate precursor was ground according to a conventional outer peripheral surface grinding method to form a GaAs single crystal substrate having a circular main surface. Thus, a GaAs single crystal substrate having a diameter D of 76 mm was obtained from Example 1.

Example 2

A GaAs single crystal substrate having a diameter D of 76 mm was obtained by the same method as in Example 1 except that the temperature gradient formed in the axial direction of the seed crystal housing member 51 was set to 0.25° C./mm in the first growing step S40.

Example 3

A GaAs single crystal substrate having a diameter D of 100 mm was obtained by the same method as in Example 1 except that the inner diameter of the cylindrical portion 52B in the crucible 5 for growing the GaAs single crystal was set to 110 mm and the temperature gradient formed in the axial direction of the seed crystal housing member 51 was set to 0.22° C./mm in the first growing step S40.

Example 4

A GaAs single crystal substrate having D of 100 mm was obtained by the same method as in Example 3 except that the temperature gradient formed in the axial direction of the seed crystal housing member 51 was set to 0.18° C./mm in the first growing step S40.

Example 5

A GaAs single crystal substrate having a diameter D of 150 mm was obtained by the same method as in Example 1 except that the inner diameter of the cylindrical portion 52B in the crucible 5 for growing the GaAs single crystal was set to 160 mm and the temperature gradient formed in the axial direction of the seed crystal housing member 51 was set to 0.12° C./mm in the first growing step S40.

Example 6

A GaAs single crystal substrate having a diameter D of 150 mm was obtained by the same method as in Example 5 except that the temperature gradient formed in the axial direction of the seed crystal housing member 51 was set to 0.31° C./mm in the first growing step S40.

Example 7

A GaAs single crystal substrate having a diameter D of 150 mm was obtained by the same method as in Example 5 except that the temperature gradient formed in the axial direction of the seed crystal housing member 51 was set to 0.13° C./mm in the first growing step S40.

Example 8

A GaAs single crystal substrate having a diameter D of 202 mm was obtained by the same method as in Example 1 except that the inner diameter of the cylindrical portion 52B in the crucible 5 for growing the GaAs single crystal was set to 212 mm and the temperature gradient formed in the axial direction of the seed crystal housing member 51 was set to 0.35° C./mm in the first growing step S40.

Comparative Example 1

A GaAs single crystal substrate having a diameter D of 76 mm was obtained by the same method as in Example 1 except that the temperature gradient formed in the axial direction of the seed crystal housing member 51 was set to 0.52° C./mm in the first growing step S40.

Comparative Example 2

A GaAs single crystal substrate having a diameter D of 76 mm was obtained by the same method as in Comparative Example 1 except that the temperature gradient formed in the axial direction of the seed crystal housing member 51 was set to 0.61° C./mm in the first growing step S40.

Comparative Example 3

A GaAs single crystal substrate having a diameter D of 100 mm was obtained by the same method as in Comparative Example 1 except that the inner diameter of the cylindrical portion 52B in the crucible 5 for growing the GaAs single crystal was set to 110 mm and the temperature gradient formed in the axial direction of the seed crystal housing member 51 was set to 0.54° C./mm in the first growing step S40.

Comparative Example 4

A GaAs single crystal substrate having D of 100 mm was obtained by the same method as in Comparative Example 3 except that the temperature gradient formed in the axial direction of the seed crystal housing member 51 was set to 0.58° C./mm in the first growing step S40.

Comparative Example 5

A GaAs single crystal substrate having a diameter D of 150 mm was obtained by the same method as in Comparative Example 1 except that the inner diameter of the cylindrical portion 52B in the crucible 5 for growing the GaAs single crystal was set to 160 mm and the temperature gradient formed in the axial direction of the seed crystal housing member 51 was set to 0.53° C./mm in the first growing step S40.

Comparative Example 6

A GaAs single crystal substrate having a diameter D of 202 mm was obtained by the same method as in Comparative Example 1 except that the inner diameter of the cylindrical portion 52B in the crucible 5 for growing the GaAs single crystal was set to 212 mm and the temperature gradient formed in the axial direction of the seed crystal housing member 51 was set to 0.61° C./mm in the first growing step S40.

Comparative Example 7

Comparative Example 7 was performed in the same method as in Comparative Example 5 except that the temperature gradient formed in the axial direction of the seed crystal housing member 51 was set to 0.08° C./mm in the first growing step S40 in an attempt to obtain a GaAs single crystal substrate having a diameter D of 150 mm. However in Comparative Example 7, the obtained substrate was formed of polycrystal GaAs, and no GaAs single crystal substrate could be obtained.

Comparative Example 8

Comparative Example 8 was performed in the same method as in Comparative Example 6 except that the temperature gradient formed in the axial direction of the seed crystal housing member 51 was set to 0.05° C./mm in the first growing step S40 in an attempt to obtain a GaAs single crystal substrate having a diameter D of 202 mm. However in Comparative Example 8, the obtained substrate was formed of polycrystal GaAs, and no GaAs single crystal substrate could be obtained.

[Evaluation of GaAs Single Crystal Substrate]

1 piece of the GaAs single crystal substrate was selected from the GaAs single crystal substrates manufactured in Examples 1 to 8 and Comparative Examples 1 to 6, and the number of etch pits formed on the main surface of each GaAs single crystal substrate was counted by the method described above. Based on the counted values, the number $C_1$ of etch pits in the first circular region, the difference $C_2-C_1$ between the number $C_2$ of etch pits in the second circular region and the number $C_1$ of etch pits in the first circular region (i.e., the number $C_2-C_1$ of etch pits in the toroidal region), and the EPD over the entire main surface were calculated for each Example and each Comparative Example. Further, another piece of the GaAs single crystal substrate was selected from the GaAs single crystal substrates manufactured in Examples 1 to 8 and Comparative Examples 1 to 6, and the atomic concentration of Si was determined for each GaAs single crystal substrate by the method described above. The results are listed in Tables 1 and 2.

Further, a ratio of the qualified GaAs single crystal substrates in which no cracks, no chips or the like occur during the manufacturing relative to the GaAs single crystal substrates manufactured in Examples 1 to 8 and Comparative Examples 1 to 6, respectively, was determined as the processing yield. The results are listed in Tables 1 and 2. In Tables 1 and 2, if the processing yield is 90% or more, it was evaluated as good; and if the processing yield is less than 90%, it was evaluated as bad.

TABLE 1

|  | Example 1 | Example 2 | Example 3 | Example 4 | Example 5 | Example 6 | Example 7 | Example 8 |
|---|---|---|---|---|---|---|---|---|
| Diameter D of main surface [mm] | 76 | 76 | 100 | 100 | 150 | 150 | 150 | 202 |
| EPD [number of etch pits/cm$^2$] | 1 | 3 | 420 | 5 | 10 | 350 | 50 | 850 |
| Number of etch pits $C_1$ in first circular region | 0 | 3 | 1 | 0 | 0 | 5 | 0 | 3 |

TABLE 1-continued

|  | Example 1 | Example 2 | Example 3 | Example 4 | Example 5 | Example 6 | Example 7 | Example 8 |
|---|---|---|---|---|---|---|---|---|
| Number of etch pits $C_2$-$C_1$ in toroidal region | 0 | 1 | 3 | 0 | 0 | 1 | 5 | 0 |
| Atomic concentration of Si [/cm$^3$] | $3.10 \times 10^{18}$ | $3.31 \times 10^{18}$ | $3.41 \times 10^{17}$ | $2.91 \times 10^{18}$ | $3.50 \times 10^{18}$ | $6.5 \times 10^{17}$ | $2.89 \times 10^{17}$ | $5.20 \times 10^{17}$ |
| Temperature gradient [° C./mm] | 0.26 | 0.25 | 0.22 | 0.18 | 0.12 | 0.31 | 0.13 | 0.35 |
| Processing yield (%) | 93.9% | 92.8% | 91.9% | 92.2% | 93.3% | 92.2% | 90.9% | 91.2% |

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Diameter D of main surface [mm] | 76 | 76 | 100 | 100 | 150 | 202 | 150 | 202 |
| EPD [number of etch pits/cm$^2$] | 302 | 10 | 281 | 105 | 52 | 1010 | — | — |
| Number of etch pits $C_1$ in first circular region | 12 | 24 | 11 | 32 | 22 | 31 | — | — |
| Number of etch pits $C_2$-$C_1$ in donut-shaped region | 8 | 7 | 28 | 25 | 35 | 41 | — | — |
| Atomic concentration of Si [/cm$^3$] | $4.20 \times 10^{17}$ | $2.80 \times 10^{18}$ | $8.90 \times 10^{17}$ | $2.30 \times 10^{18}$ | $1.54 \times 10^{18}$ | $7.60 \times 10^{18}$ | — | — |
| Temperature gradient [° C./mm] | 0.52 | 0.61 | 0.54 | 0.58 | 0.53 | 0.61 | 0.08 | 0.05 |
| Processing yield (%) | 88.1% | 88.9% | 87.9% | 87.8% | 87.8% | 87.1% | — | — |

DISCUSSION

According to Table 1 and Table 2, it is obvious that the number $C_1$ of etch pits in the first circular region was 10 or less in each GaAs single crystal substrate of Examples 1 to 8, and the number of etch pits in the main surface was reduced as compared with each GaAs single crystal substrate of Comparative Examples 1 to 6. Thus, according to Examples 1 to 8, it is possible to provide a GaAs single crystal substrate in which the dislocation density is reduced, thereby contributing to the production of a high-quality semiconductor device. In particular, the processing yield in each of Examples 1 to 8 is good. Among the Examples 1 to 8, since the EPD is also lower in Examples 1, 2, 4, 5 and 7, it is possible to sufficiently reduce the dislocation density in the GaAs single crystal substrate.

The embodiments and examples of the present invention are described above. However, proper combinations of the constitutions of the respective embodiments and the respective specific examples are also originally intended.

It should be understood that the embodiments and examples disclosed herein have been presented for the purpose of illustration and description but not limited in all aspects. It is intended that the scope of the present invention is not limited to the embodiments and examples described above but defined by the scope of the claims and encompasses all modifications equivalent in meaning and scope to the claims.

REFERENCE SIGNS LIST

1: gallium arsenide single crystal substrate (GaAs single crystal substrate); 2: main surface; 3: plane; 5: crucible; 7: single crystal growth apparatus; 51: seed crystal housing member; 52: single crystal growing member; 52A: conical portion; 52B: cylindrical portion; 61: GaAs seed crystal; 71: upper crucible-supporting member; 72: lower crucible-supporting member; 73: heating member; 74: heat insulating material; 81: GaAs single crystal; 82: raw material melt; 83: liquid sealing agent; D: diameter; OF: orientation flat; IF: index flat; θ: off angle

The invention claimed is:

1. A gallium arsenide single crystal substrate having a circular main surface,
when the diameter of the main surface of the gallium arsenide single crystal substrate is represented by D and the number of etch pits formed on the main surface by immersing the gallium arsenide single crystal substrate in molten potassium hydroxide at 500° C. for 10 minutes is counted, the number $C_1$ of etch pits in a first circular region having a diameter of 0.2D around the center of the main surface being 0 or more and 10 or less, wherein
the diameter D of the gallium arsenide single crystal substrate is not less than 75 mm and not more than 205 mm.

2. The gallium arsenide single crystal substrate according to claim 1, wherein
the number $C_1$ of etch pits in the first circular region of the gallium arsenide single crystal substrate is 0 or more and 5 or less.

3. The gallium arsenide single crystal substrate according to claim 1, wherein
a difference $C_2$-$C_1$ between the number $C_2$ of etch pits in a second circular region having a diameter of 0.5D around the center of the main surface of the gallium arsenide single crystal substrate and the number $C_1$ of etch pits in the first circular region thereof is 0 or more and 5 or less.

4. The gallium arsenide single crystal substrate according to claim 1, wherein
an etch pit density representing the number of etch pits in 1 cm² of the main surface of the gallium arsenide single crystal substrate is 0 or more and 1000 or less.

5. The gallium arsenide single crystal substrate according to claim 1, wherein
the main surface of the gallium arsenide single crystal substrate is a {100} plane.

6. The gallium arsenide single crystal substrate according to claim 1, wherein
the main surface of the gallium arsenide single crystal substrate has an off angle of greater than 0° and equal to or less than 15° from the {100} plane.

7. The gallium arsenide single crystal substrate according to claim 1, wherein
the gallium arsenide single crystal substrate has an n-type conductivity.

8. The gallium arsenide single crystal substrate according to claim 1, wherein
the gallium arsenide single crystal substrate contains silicon, and
the atomic concentration of the silicon is $1 \times 10^{16}$ cm$^{-3}$ or more and $1 \times 10^{19}$ cm$^{-3}$ or less.

9. A gallium arsenide single crystal substrate having a circular main surface,
when the diameter of the main surface of the gallium arsenide single crystal substrate is represented by D and the number of etch pits formed on the main surface by immersing the gallium arsenide single crystal substrate in molten potassium hydroxide at 500° C. for 10 minutes is counted, the number $C_1$ of etch pits in a first circular region having a diameter of 0.2D around the center of the main surface being 0 or more and 10 or less, wherein
the diameter D of the gallium arsenide single crystal substrate is not less than 100 mm and not more than 205 mm.

* * * * *